United States Patent [19]

Erickson

[11] Patent Number: 5,436,557
[45] Date of Patent: Jul. 25, 1995

[54] CURRENT SENSOR WHICH IS ATTACHABLE TO AN EXTERNAL OBJECT BY RETENTION BETWEEN THE EXTERNAL OBJECT AND AN ELECTRICAL CONDUCTOR

[75] Inventor: Timothy K. Erickson, Lena, Ill.
[73] Assignee: Honeywell Inc., Minneapolis, Minn.
[21] Appl. No.: 203,134
[22] Filed: Feb. 28, 1994
[51] Int. Cl.⁶ .............................................. G01R 19/00
[52] U.S. Cl. .............................. 324/117 H; 324/127; 336/208; 336/174
[58] Field of Search ................. 336/208, 83, 174; 324/251, 127, 117 H

[56] References Cited

U.S. PATENT DOCUMENTS

| | | | |
|---|---|---|---|
| 2,920,297 | 1/1960 | Spicer | 336/174 |
| 3,162,829 | 12/1964 | Wildy | 336/83 |
| 4,059,798 | 11/1977 | Dierker | 324/251 |
| 4,754,250 | 6/1988 | Duin | 336/208 |
| 5,180,970 | 1/1993 | Ross. | |

Primary Examiner—Kenneth A. Wieder
Assistant Examiner—Mark Wardas
Attorney, Agent, or Firm—William D. Lanyi

[57] ABSTRACT

A current sensor is provided with a planar member formed within a first opening of the sensor housing and extending inwardly from an inner periphery of the housing. The planar member extends into the first opening and is provided with a second opening through its structure. The second opening formed in the planar member is shaped to permit a portion of an electrical conductor to extend therethrough. The planar member is captured between a portion of the electrical conductor and an external object in order to permit the current sensor to be rigidly retained in a predetermined position relative to the external object. This means of fastening a current sensor to an external object eliminates the need for additional rivets, screws and bolts that would otherwise be required to perform this function.

11 Claims, 4 Drawing Sheets

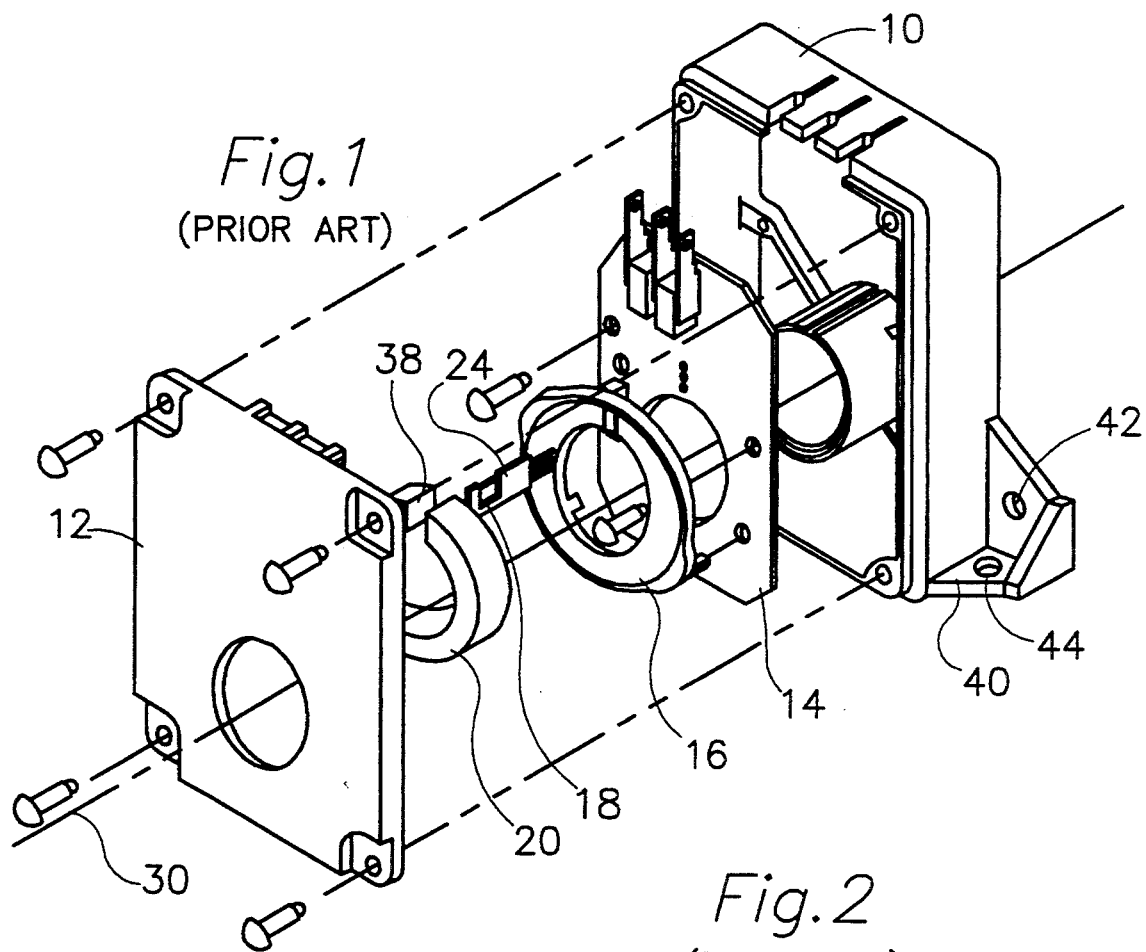
Fig.1 (PRIOR ART)
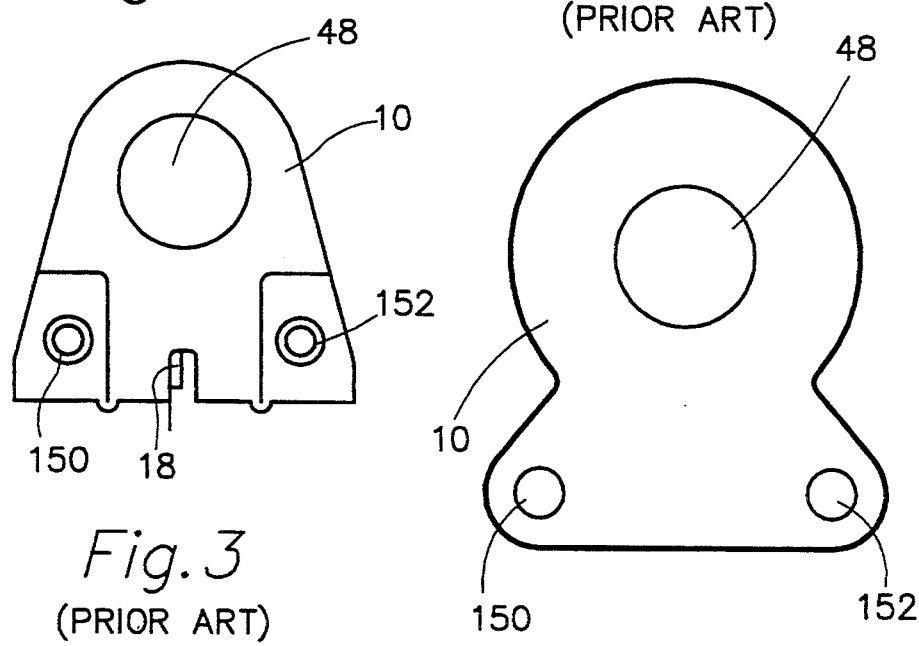
Fig.2 (PRIOR ART)
Fig.3 (PRIOR ART)

CURRENT SENSOR WHICH IS ATTACHABLE TO AN EXTERNAL OBJECT BY RETENTION BETWEEN THE EXTERNAL OBJECT AND AN ELECTRICAL CONDUCTOR

BACKGROUND OF THE INVENTION

1. Field of the Invention

The present invention is generally related to a current sensor and, more particularly, to a current sensor which comprises a housing that is formed to provide a planar member that can be captured between an electrical conductor which serves as a primary winding of the current sensor and an external object on which the current sensor is to be mounted.

2. Description of the Prior Art

Many different types of current sensors are well known to those skilled in the art. The current sensors can comprise magnetically sensitive components, such as Hall effect devices, and magnetically permeable core members or, alternatively, the current sensors can comprise a current transformer with a toroidal secondary winding disposed within a housing and shaped to receive a primary winding through a centrally located opening thereof.

Regardless of the particular construction and operation of the current sensor, most current sensors require some means to attach the housing to an external object. In most known applications of this type, the housing of the current sensor is molded to form feet or tabs extending therefrom and holes are formed in the feet or tabs to permit screws, bolts or rivets to attach the housing to an external object. Alternatively, holes are formed through a portion of the housing itself for the same purposes.

U.S. Pat. 5,180,970, which issued to Ross on Jan. 19, 1993, describes a mechanically adjustable current sensor and a method for making the same. The current sensor is provided with a flux concentrator which is made of two or more annular laminae. Each lamina plate is provided with a gap that is formed in its circumferential length. Each lamina plate has a gap which is defined by two opposing faces. The laminae are stacked with their planar surfaces in contact and in such a way so as to define a central opening. The gaps of the laminae are arranged proximate each other. One lamina plate is rotated relative to another in order to change the width of the effective gap by misaligning the faces of one gap relative to another. The lamina plate is rotated during the manufacture of the current sensor while an output voltage signal is measured as a function of the current passing through an opening of the flux concentrator. The degree of rotation of the laminae plate is determined as a function of the output signal in order to achieve a preselected current/voltage relationship. By achieving a consistent relationship between current sensors made in accordance with the present invention, interchangeability from one current sensor to another can be achieved in a low cost current sensor.

In most applications of current sensors, a primary electrical conductor extends through a central opening of the sensor. Typically, the primary conductor is placed in its position through the opening of the sensor after the sensor is attached to the external object, such as a printed circuit board (PCB). Therefore, the manufacture of a device using a current sensor usually requires two separate operations to be performed. First, a plurality of screws, bolts or rivets are associated with holes formed in the housing, or tabs attached to the housing, and the current sensor is attached to the external object. After this attachment process is complete, a primary electrical conductor is associated with the sensor and extended through its central opening.

It would therefore be beneficial if the manufacturing and assembly operation of a device which uses a current sensor could be minimized by removing the necessity of the dual operations of attaching the sensor to an external object and then arranging a primary electrical conductor through the opening of the current sensor.

SUMMARY OF THE INVENTION

A current sensor made in accordance with the present invention comprises a housing which has a first opening extending through it. The housing is provided with an outer periphery and an inner periphery. The inner periphery is disposed around the first opening extending through the housing. A toroidal member is disposed within the housing and extends around the first opening. A planar member is attached to the housing, or formed as an integral part of the housing, and extends inwardly into the first opening from the inner periphery. The planar member is provided with a second opening extending therethrough.

An electrical conductor extends through the first opening and through a second opening. The electrical conductor is disposed through a central portion of the toroidal member and is attachable to an external object, such as a printed circuit board. The planar member is disposable between a portion of the electrical conductor and the external object in order to rigidly retain the sensor in a predetermined position relative to the external object.

In one particularly preferred embodiment of the present invention, the current sensor comprises a Hall effect device that is disposed within a gap formed in the toroidal member, which is a magnetically permeable core. In an alternative embodiment of the present invention, the current sensor is a current transformer and the toroidal member is the secondary winding of the current transformer which is disposed around the electrical conductor that is the primary winding of the current transformer.

The second opening, which extends through the planar member within the first opening, can be any one of several possible shaped. In one embodiment of the present invention, the second opening comprises two holes that are shaped to permit legs of the electrical conductor to pass therethrough. In another embodiment of the present invention, the planar member comprises a rim that extends around the periphery of the housing and around the second opening. This rim is then captured between an extension portion of the electrical conductor and external object, such as a printed circuit board. Regardless of the particular shape and configuration of the planar member and of the second opening, they cooperate to permit the planar member to be captured between a portion of the electrical conductor and an external object to retain the current sensor in a predetermined position relative to the external object. In addition, the housing of the current sensor can be of several different shapes and still incorporate the principles of the present invention. For example, the housing can be generally toroidal in shape or, alternatively, can be rectangular. The first opening, which extends through the housing, can also be either circular or rectangular in shape. The particular shape of the housing and its central opening will depend on the particular application of the current sensor and the desired operational characteristic of the sensor.

BRIEF DESCRIPTION OF THE DRAWINGS

The present invention will be more fully understood from a reading of the Description of the Preferred Embodiment in conjunction with the drawings, in which:

FIG. 1 shows an exploded view of a current sensor known to those skilled in the art;

FIG. 2 shows a plane view of a current sensor known to those skilled in the art;

FIG. 3 shows a plane view of a current sensor known to those skilled in the art;

DESCRIPTION OF THE PREFERRED EMBODIMENT

Figure 4:
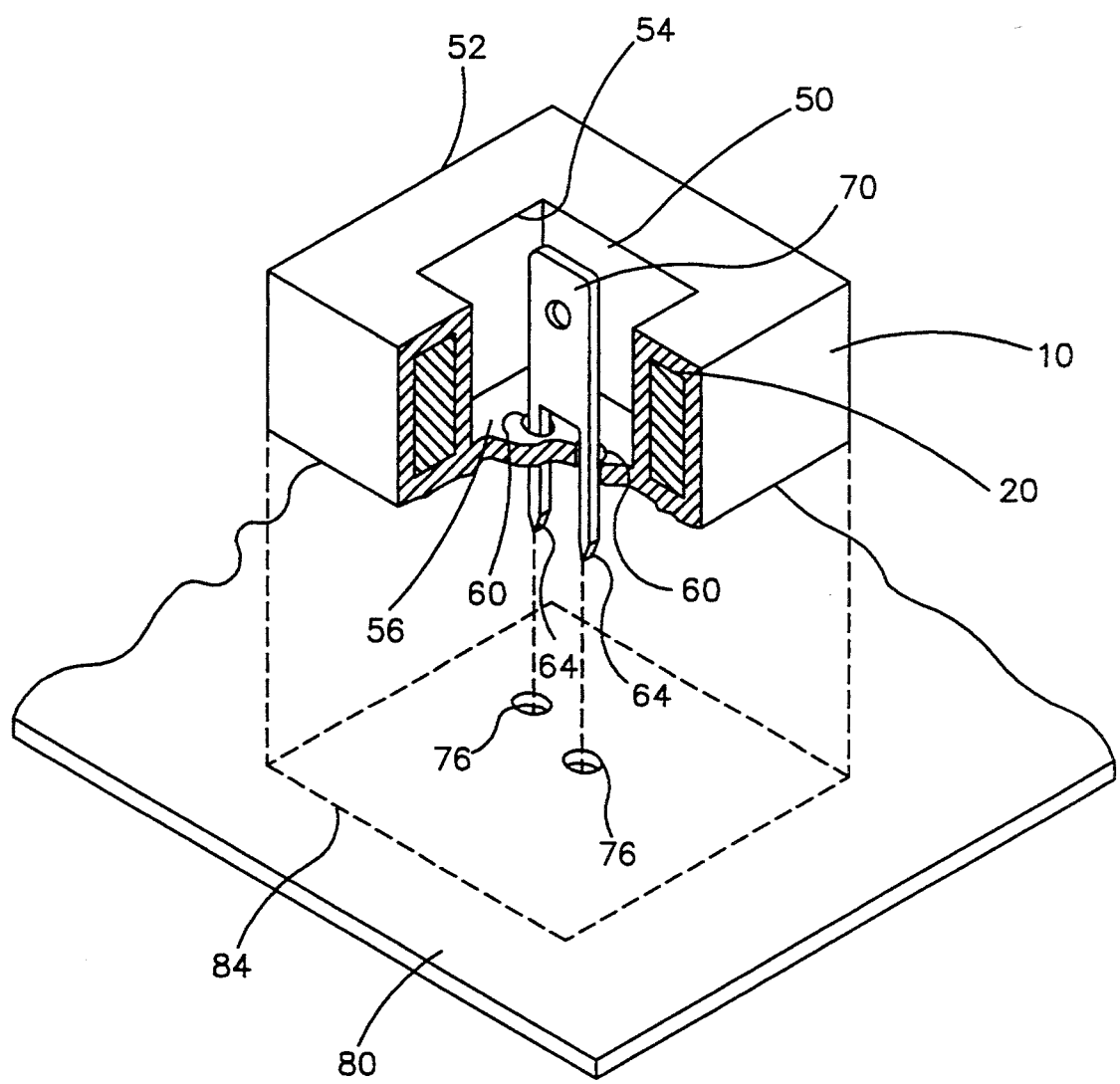
FIG. 4 illustrates a perspective section view of one embodiment of the present invention.

Throughout the Description of the Preferred Embodiment, like components will be identified by like reference numerals.

FIG. 1 illustrates an exploded view of a known type of current sensor. A housing 10 and a cover 12 cooperate with each other to form a housing member which protects the inner portions of the current sensor. A printed circuit board 14, a holder 16, a magnetically sensitive component 18 and a magnetically permeable core 20 are arranged as shown within the housing 10 and under the cover 12. The magnetically sensitive component 18 is disposed on a ceramic chip package 24 which is provided with a plurality of electrical leads that are connectable to conductors on the printed circuit board 14.

In FIG. 1, a centerline 30 is shown extending through openings in the cover 12, the magnetically permeable core 20, the holder 16, the printed circuit board 14 and the housing 10. When the components are attached to each other and the cover 12 is attached to the housing 10, these openings combine to define a central opening in the housing structure through which a primary electrical conductor can be extended. The basic operation of a current sensor, such as the one shown in FIG. 1, is that the electrical current passing through a primary electrical conductor will result in lines of flux extending through the magnetically permeable core 20. The magnetically sensitive component 18 is disposed within a gap 38 formed in the core 20. The intensity of the magnetic flux passing through the magnetically sensitive component 18 provides a representative signal that is used to determine the current passing through the primary electrical conductor. In a current sensor such as that illustrated in FIG. 1, a magnetically sensitive component 18, such as a Hall effect device, is used. An alternative device, that can also be used to measure the flow of current in a primary electrical conductor, is a current transformer. Instead of a core 20 and a magnetically sensitive component 18, a current transformer would provide a secondary winding disposed around the central opening of the housing structure and contained within the housing 10. The electrical conductor extended through the central opening of the current sensor would serve as the primary winding of the current transformer.

Regardless of the particular type of sensor used within the housing, it is often necessary to provide a means for rigidly attaching the current sensor to an external object, such as a printed circuit board or an electrical equipment cabinet. With reference to FIG. 1, a foot, or tab 40, is attached to the housing 10 and provided with holes, 42 and 44, that permit the housing 10 to be attached to the external object. Holes 42 permit the housing 10 to be attached to an external object with the centerline 30 perpendicular to the object. Holes 44 permit the housing 10 to be attached to an external object with the centerline 30 disposed in generally parallel association with the object.

When the current sensor is being attached to the external object, an operator must first arrange the current sensor in its proper association with the external member and then use screws, bolts or rivets to attach the housing 10 to the external member as described above. Then, as a separate operation, a primary electrical conductor must be extended through the central opening of the sensor along the direction of the centerline 30.

FIG. 2 shows an alternative shape of a current sensor It has a housing 10 with an opening 48 formed therethrough. Additional openings, 150 and 152, are formed through the housing 10 in order to permit screws, rivets or bolts to extend through the body of the current sensor and attach the current sensor to the external object.

FIG. 3 shows a current sensor having a housing 10 and a central opening 48 extending therethrough. It also is provided with two openings 150 and 152 that extend through the body of the current sensor and permit the sensor to be attached to an external object, such as a printed circuit board, through the use of bolts, screws or rivets. FIG. 3 also shows a magnetically sensitive component 18, such as a Hall effect element disposed at a position where the gap 38 in a magnetically sensitive core 20 is disposed within the housing structure.

FIG. 4 illustrates one embodiment of the present invention. The toroidal member 20 is illustrated schematically within the housing 10. It should be understood that the particular shape of the toroidal member 20 is not limiting to the present invention. In addition, it should be understood that the shape and size of the housing 10 is not limiting to the present invention. Both the housing 10 and the toroidal member 20 can be circular or rectangular in shape.

With continued reference to FIG. 4, a first opening 50 is formed through the housing 10. The first opening 50 extends through both the housing 10 and the toroidal member 20. The housing 10 has an outer periphery 52 and an inner periphery 54. A planar member 56 extends from the inner periphery 54 of the housing 10 inwardly into the first opening 50.

With continued reference to FIG. 4, a second opening 60 is formed through the planar member 56. In the embodiment shown in FIG. 4, the second opening 60 comprises two holes which are shaped to receive legs 64 of an electrical conductor 70. The legs 64 of the electrical conductor 70 can extend through the second opening 60 and into holes 76 that are formed in an external object 80, such as a printed circuit board.

As can be seen in FIG. 4, the housing 10 can be placed on the external object 80 in the area marked by dashed line 84. The legs 64 of the electrical conductor 70 can be extended through the second opening 60 and through holes 76. The body of the electrical conductor 70 therefore can capture a portion of the planar member 56 between it and the external object 80. If the legs 64 are deformed in some way or otherwise attached to the underside of the external object 80, the planar member 56 of the current sensor will be captured between the electrical conductor 70 and the external object 80. Therefore, the current sensor will be rigidly retained in a predetermined position relative to the external object.

Figure 5A:
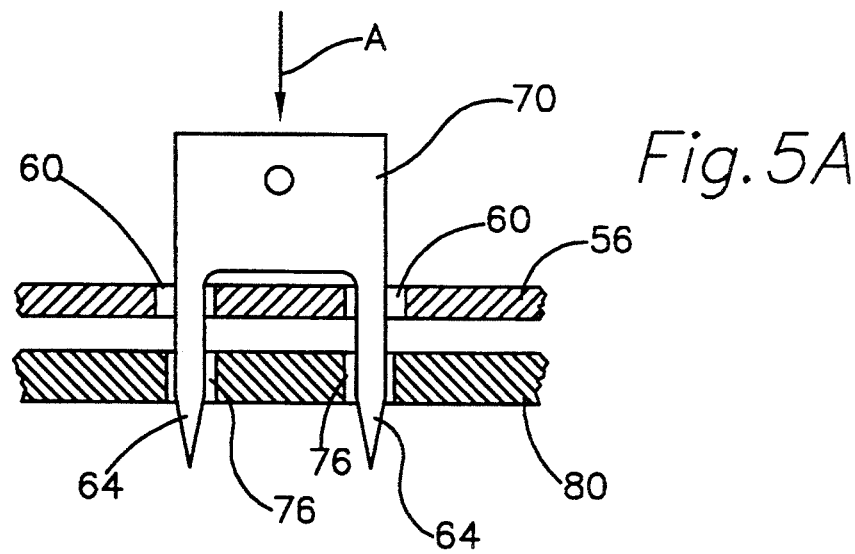
FIGS. 5A and 5B show two sectional views of the embodiment illustrated in FIG. 4.

With continued reference to FIG. 4, the electrical conductor 70 serves as both the primary electrical conductor of the current sensor and the means to retain the current sensor in position. This eliminates the need for additional holes formed in feet or tabs of the housing and also eliminates the need for rivets, bolts or screws to retain the current sensor in its proper position. Therefore, the present invention also reduces the assembly time and costs of attaching the current sensor to an external object such as a printed circuit board. FIG. 5A illustrates a sectional view of the embodiment illustrated perspectively in FIG. 4. By pushing downward on the electrical conductor 70, as represented by arrow A, the body of the electrical conductor 70 will cause the planar member 56 to be pushed down against the external object 80. The legs 64 of the electrical conductor 70 extend through the second opening 60 formed in the planar member 56 and also through holes 76 in the printed circuit board.

Figure 5B:
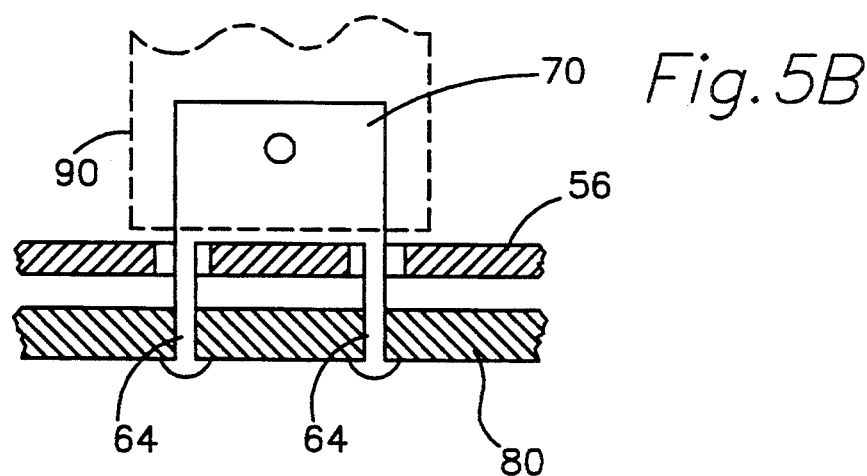

FIG. 5B illustrates the configuration of FIG. 5A after the planar member 56 is pressed downward against the external object 80 and the distal ends of the legs 64 are deformed or otherwise attached to the back side of the external member 80. The planar member 56 is rigidly attached between a portion of the electrical conductor 70 and the external member 80. In FIG. 5B, a dashed line 90 is used to represent a portion of an electrical conductor that is shaped to receive the blade of electrical conductor 70 therein. In other words, the blade of the electrical conductor 70 acts as a male connector and the device represented by dashed line 90 acts as the female connector which permits two electrical conductors to be connected together to form the primary conductor that extends through the first opening 50 of the current sensor. FIGS. 5A and 5B illustrate one embodiment of the present invention in which the second opening 60 comprises two holes that receive two legs 64 of the electrical conductor 70.

Figure 6:
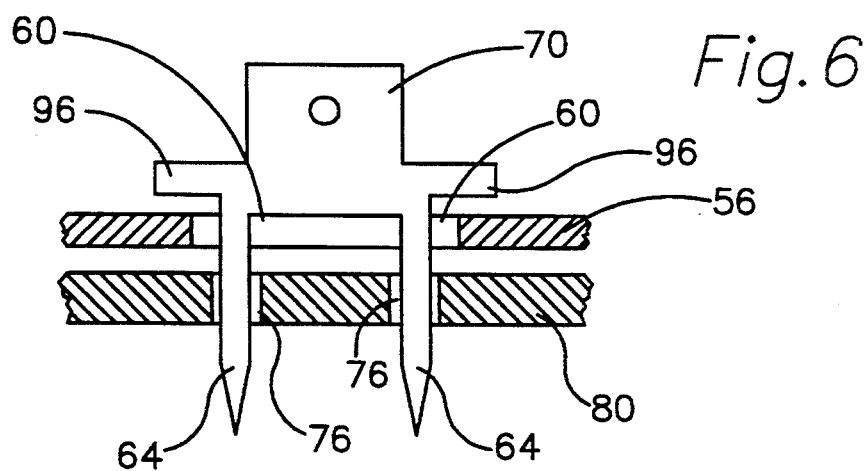
FIG. 6 shows a sectional view of an alternative embodiment of the present invention.

FIG. 6 illustrates an alternative embodiment of the present invention in which the second opening 60 is a single hole formed through the planar member 56. In the embodiment shown in FIG. 6, the second opening 60 requires that the electrical conductor 70 be provided with an extension portion 96 that can capture the planar member 56 between it and the external object 80. In other words, the second opening 60 can be a single hole as long as a portion of the planar member 56 can be compressed between a portion of electrical conductor 70 and the external object 80.

Figure 7:
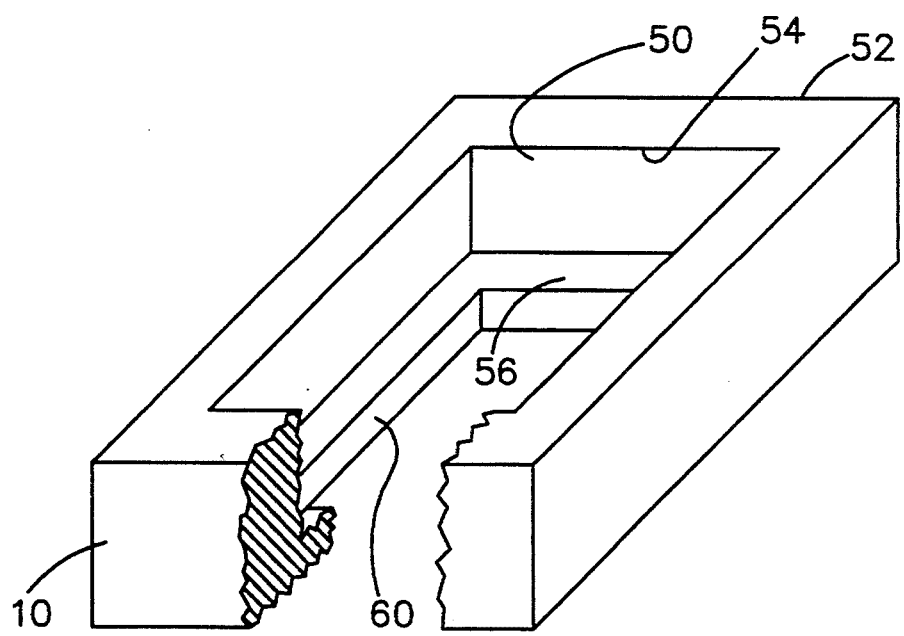
FIG. 7 shows a perspective view of a housing used in association with the embodiment illustrated in FIG. 6.

FIG. 7 illustrates a perspective view of a housing made in accordance with the embodiment of the present invention shown in FIG. 6. Although not shown in FIG. 7, a toroidal member is enclosed within it in a matter similar to that shown in FIG. 4. The housing 10 is provided with the first opening 50. An outer periphery 52 and an inner periphery 54 are provided and a planar member 56 extends inwardly from the inner periphery 54 into the first opening 50 formed in the housing. In the embodiment shown in FIG. 7, the second opening 60 is a single hole formed through the planar member 56 which leaves a relatively small rim extending inwardly from the inner periphery 54 of the housing 10. This relatively small rim is sufficient to retain the current sensor in position if the electrical conductor 70 is properly shaped to have a portion that can capture between it and an external object as described above.

As described above, the present invention provides a current sensor with a first opening that is formed through the housing of the sensor and a planar member extending inwardly from the inner periphery of the housing. The planar member is a thin membrane or diaphragm that is of sufficient strength to retain the current sensor in a predetermined position when the planar member is captured between a portion of an electrical conductor and an external object. This eliminates the need for additional feet or tabs and additional mounting holes formed in the housing of the sensor. In addition, it also eliminates the manual effort of attaching the sensor housing to an external object with screws, bolts or rivets.

Although a particular embodiment of the present invention has been described above and illustrated, it should be understood that alternative embodiments are within the scope of the present invention.

The embodiments of the invention in which an exclusive property or right is claimed are defined as follows:

1. A current sensor, comprising:
    a housing having a first opening extending into it, said housing having an outer periphery and an inner periphery, said inner periphery being disposed around said first opening;
    a toroidal member disposed within said housing and around said first opening, said toroidal member being magnetically responsive to a current flowing through said first opening;
    a planar member attached to said housing, said planar member extending inward from said inner periphery, said planar member having a second opening extending therethrough;
    an electrical conductor extending through said first opening and said second opening, said electrical conductor being disposed through a central portion of said toroidal member, said electrical conductor being attachable to an external object, said planar member being disposable between a portion of said electrical conductor and said external object to rigidly retain said sensor in a predetermined position relative to said external object; and
    means, associated with said toroidal member, for measuring said current flowing through said electrical conductor as a function of a magnetic response in said toroidal member.

2. The current sensor of claim 1, wherein:
    said external object is a printed circuit board.

3. The current sensor of claim 1, wherein:
    said current sensor further comprises a Hall effect device associated with said toroidal member.

4. The current sensor of claim 1, wherein:
    said toroidal member is a magnetically permeable core.

5. The current sensor of claim 4, wherein:
    said magnetically permeable core has a gap formed therein, said gap being shaped to receive a magnetically sensitive component.

6. The sensor of claim 1, wherein:

said second opening is in the form of two holes shaped to receive two legs of said electrical conductor.

7. The sensor of claim 1, wherein:

said second opening comprises a single hole extending through said planar member, said electrical conductor being shaped to capture a portion of said planar member which extends around said single hole between said external object and said electrical conductor.

8. The current sensor of claim 1, wherein:
said housing is generally toroidal in shape.

9. The current sensor of claim 1, wherein:
said housing is generally rectangular in shape.

10. The current sensor of claim 1, wherein: said first opening is generally circular in shape.

11. The current sensor of claim 1, wherein:
said first opening is generally rectangular in shape.

* * * * *